(12) United States Patent
Quick et al.

(10) Patent No.: US 8,741,688 B2
(45) Date of Patent: Jun. 3, 2014

(54) METHODS OF FORMING A METAL CHALCOGENIDE MATERIAL

(75) Inventors: Timothy A. Quick, Boise, ID (US); Stefan Uhlenbrock, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/556,751

(22) Filed: Jul. 24, 2012

(65) Prior Publication Data
US 2014/0027775 A1    Jan. 30, 2014

(51) Int. Cl.
*H01L 21/00* (2006.01)

(52) U.S. Cl.
USPC .................................. 438/95; 438/85; 257/53

(58) Field of Classification Search
USPC ........... 438/85, 94, 478, 95; 257/53, E21.114
See application file for complete search history.

(56) References Cited

U.S. PATENT DOCUMENTS

| | | | |
|---|---|---|---|
| 5,157,136 A | 10/1992 | Arnold et al. | |
| 7,960,205 B2 | 6/2011 | Xiao et al. | |
| 8,008,117 B2 | 8/2011 | Hunks et al. | |
| 8,093,140 B2 | 1/2012 | Chen et al. | |
| 8,148,197 B2 | 4/2012 | Marsh | |
| 8,470,636 B2 * | 6/2013 | Radu et al. | 438/95 |
| 2010/0009078 A1 | 1/2010 | Pore et al. | |
| 2010/0261304 A1* | 10/2010 | Chang et al. | 438/72 |
| 2011/0214725 A1* | 9/2011 | Beck | 136/255 |
| 2011/0263100 A1* | 10/2011 | Hunks et al. | 438/478 |
| 2012/0171378 A1* | 7/2012 | Xiao et al. | 427/255.35 |

OTHER PUBLICATIONS

Licausi et al., Lo-Pressure Chemical Vapor Deposition of CdS and Atomic Layer Deposition of CdTe Films for HgCdTe Surface Passivation, Journal of Electronic Materials, vol. 40, No. 8, pp. 1668-1673 (2011).

* cited by examiner

*Primary Examiner* — Phuc Dang
(74) *Attorney, Agent, or Firm* — TraskBritt (57) ABSTRACT

Accordingly, a method of forming a metal chalcogenide material may comprise introducing at least one metal precursor and at least one chalcogen precursor into a chamber comprising a substrate, the at least one metal precursor comprising an amine or imine compound of an alkali metal, an alkaline earth metal, a transition metal, a post-transition metal, or a metalloid, and the at least one chalcogen precursor comprising a hydride, alkyl, or aryl compound of sulfur, selenium, or tellurium. The at least one metal precursor and the at least one chalcogen precursor may be reacted to form a metal chalcogenide material over the substrate. A method of forming a metal telluride material, a method of forming a semiconductor device structure, and a semiconductor device structure are also described.

18 Claims, 5 Drawing Sheets

| Image Statistics | |
|---|---|
| Img. Z range | 20.841 nm |
| Img. Rms (Rq) | 1.611 mm |
| Img. Ra | 1.179 nm |

METHODS OF FORMING A METAL CHALCOGENIDE MATERIAL

FIELD

The disclosure, in various embodiments, relates generally to the field of semiconductor device design and fabrication. More specifically, the disclosure relates to methods of forming a metal chalcogenide material, to related methods of forming a semiconductor device structure, and to a related semiconductor device structure.

BACKGROUND

Over the past few decades, there has been interest in chalcogenide materials for use in semiconductor devices, such as non-volatile memories, solar cells, photodetectors, or electroconductive electrodes. For example, chalcogenide materials have been used in phase change random access memory devices. Chalcogenide materials are capable of stably transitioning between physical states (e.g., amorphous, semi-amorphous, and crystalline states) upon the application of a physical signal (e.g., a high current pulse, or a low current pulse). Each physical state can exhibit a particular resistance that may be used to distinguish logic values of a phase change memory random access memory cell.

One of the current difficulties associated with the use of chalcogenide materials in semiconductor device structures is the formation of the material. Chalcogenide materials have been formed by physical vapor deposition (PVD), chemical vapor deposition (CVD), and atomic layer deposition (ALD). PVD and CVD processes lack the conformality needed to uniformly deposit material on a substrate, as integrated circuit scaling approaches less than or equal to 10 nanometers (nm). In addition, due to the equipment and targets needed, PVD processes can be expensive. ALD processes have been used to form chalcogenide materials by reacting alkyl tellurides and alkyl selenides with volatile, pyrophoric, alkyl reactants to form metal tellurides or metal selenides. For example, alkyl tellurides have been reacted with dimethylcadmium to form cadium telluride through ALD processes. However, ALD processes for forming chalcogenide materials are limited by the availability (e.g., volatile alkyl compounds suitable for reaction with tellurium compounds in ALD processes do not exist for many for many metals), reactivity, and toxicity of appropriate ALD precursors.

It would be desirable to be able to form additional chalcogenide materials using ALD processes. It would be further desirable if chalcogenide materials formed using the ALD processes exhibited high purity, and if any precursors used in the formation of the chalcogenide materials were readily available, less toxic, and non-pyrophoric.

DETAILED DESCRIPTION

Methods of forming a metal chalcogenide material by atomic layer deposition (ALD) are disclosed, as are related methods of forming semiconductor device structures including the metal chalcogenide material, and related semiconductor device structures. As used herein, the term "atomic layer deposition" or "ALD" means and includes a vapor deposition process in which a plurality of separate deposition cycles are conducted in a chamber. ALD includes, but is not limited to, atomic layer epitaxy (ALE), molecular beam epitaxy (MBE), gas source MBE, organometallic MBE, and chemical beam epitaxy when performed with alternating pulses of precursors and purge (i.e., inert) gas. In some embodiments, during each deposition cycle of the ALD process of the disclosure, metal precursors, each including one of an amine ligand and an imine ligand, may be chemisorbed to a substrate in a chamber, excess metal precursors may be purged out of the chamber, chalcogen precursors (e.g., tellurium-containing compounds, selenium-containing compounds, or sulfur-containing compounds) may be introduced into the chamber to react with the chemisorbed metal precursors, and excess precursors and byproducts may be removed from the chamber. In additional embodiments, the deposition order of the metal precursors and the chalcogen precursors may be reversed. By repeating the deposition and purge acts, the metal chalcogenide material is formed by ALD. The metal chalcogenide material may exhibit minimal oxygen, carbon, or nitrogen impurities, if any. The metal chalcogenide material may be used as a thin film for a semiconductor device structure, such as a photovoltaic device structure, a memory device structure (e.g., a phase change random access memory cell, a resistive random access memory cell, etc.), or an electronic switch. The methods disclosed herein may facilitate excellent performance and stability in semiconductor device structures (e.g., memory cells, photovoltaic device structures, etc.) and semiconductor devices (e.g., memory devices, photovoltaic devices, etc.) including a metal chalcogenide material.

The following description provides specific details, such as material types and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques. Also note, any drawings presented herein are for illustrative purposes only, and are thus not drawn to scale. Additionally, elements common between figures may retain the same numerical designation.

Figure 1:
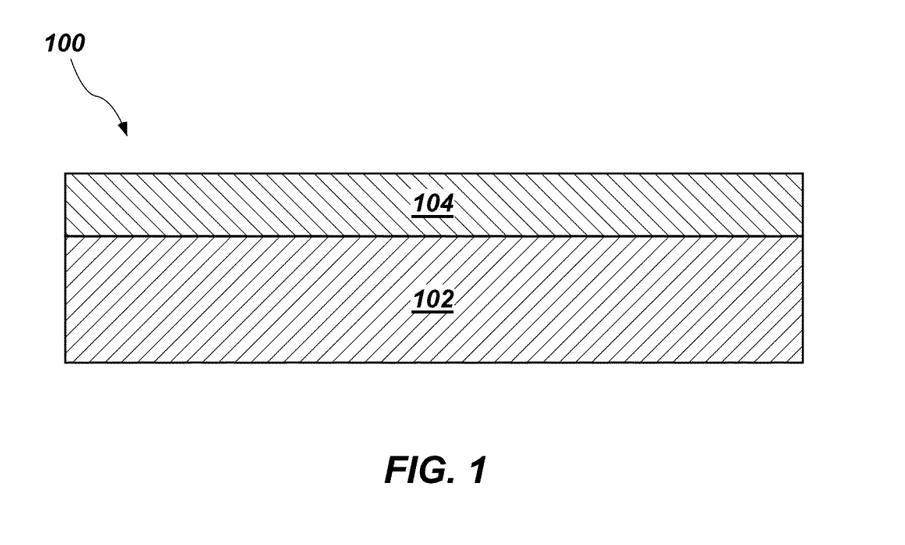
FIG. 1 illustrates a partial cross-sectional view of a semiconductor device structure, in accordance with an embodiment of the disclosure.

FIG. 1 is simplified partial cross-sectional view illustrating a semiconductor device structure 100 formed using an embodiment of the method of the disclosure. The semiconductor device structure 100 may include a substrate 102 and a metal chalcogenide material 104. The metal chalcogenide material 104 may be formed on or over the substrate 102. As used herein, the term "substrate" means and includes a base material or construction upon which additional materials are formed. The substrate 102 may be a semiconductor substrate, a base semiconductor layer on a supporting structure, a metal electrode, or a semiconductor substrate having one or more materials, structures, or regions formed thereon. Previous process acts may have been conducted to form materials, regions, or junctions in the base semiconductor structure or foundation. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. By way of non-limiting example, the substrate 102 may be silicon, silicon dioxide, silicon with native oxide, silicon nitride, glass, semiconductor, metal oxide, metal, a titanium nitride (TiN), tantalum (Ta), a tantalum nitride (TaN), niobium (Nb), a niobium nitride (NbN), a molybdenum nitride (MoN), molybdenum (Mo), tungsten (W), a tungsten nitride (WN), copper (Cu), cobalt (Co), nickel (Ni), iron (Fe), aluminum (Al), or a noble metal.

The metal chalcogenide material 104 includes at least one metal chalcogenide compound including a chalcogen (e.g., tellurium, selenium, or sulfur) bonded to at least one metal. As used herein, the term "metal" means and includes an alkali metal, an alkaline earth metal, a transition metal (e.g., titanium, zirconium, hafnium, vanadium, niobium, tantalum, chromium, molybdenum, tungsten, manganese, iron, cobalt, nickel, palladium, platinum, copper, silver, gold, zinc, cadmium, etc.), a post-transition metal (e.g., aluminum, gallium, indium, tin, lead, bismuth, etc.), or a metalloid (e.g., boron, silicon, germanium, arsenic, antimony, etc.). The metal chalcogenide material 104 may include a single metal chalcogenide compound species or may include multiple metal chalcogenide compound species. In some embodiments, the metal chalcogenide material 104 includes microsegregated areas of the metal and the chalcogen. In additional embodiments, the metal chalcogenide material 104 includes a greater proportion of the metal relative to the chalcogen, and may be characterized as "rich" in the metal.

By way of non-limiting example, the metal chalcogenide material 104 may be formed of and include zirconium telluride ($ZrTe_x$), copper telluride ($CuTe_x$), silver telluride ($AgTe_x$), gold telluride ($AuTe_x$), zinc telluride ($ZnTe_x$), aluminum telluride ($AlTe_x$), gallium telluride ($GaTe_x$), indium telluride ($InTe_x$), tin telluride ($SnTe_x$), bismuth telluride ($BiTe_x$), germanium telluride ($GeTe_x$), arsenic telluride ($ArTe_x$), antimony telluride ($SbTe_x$), zirconium selenide ($ZrSe_x$), copper selenide ($CuSe_x$), silver selenide ($AgSe_x$), gold selenide ($AuSe_x$), zinc selenide ($ZnSe_x$), aluminum selenide ($AlSe_x$), gallium selenide ($GaSe_x$), indium selenide ($InSe_x$), tin selenide ($SnSe_x$), bismuth selenide ($BiSe_x$), germanium selenide ($GeSe_x$), arsenic selenide ($ArSe_x$), antimony selenide ($SbSe_x$), bismuth selenide ($BiSe_x$), zirconium sulfide ($ZrS_x$), copper sulfide ($CuS_x$), silver sulfide ($AgS_x$), gold sulfide ($AuS_x$), zinc sulfide ($ZnS_x$), bismuth sulfide ($BiS_x$), indium sulfide ($InS_x$), or antimony sulfide ($SbS_x$). In some embodiments, the metal chalcogenide material is formed of and includes zirconium telluride ($ZrTe_x$). Formulae including "x" above (e.g., $ZrTe_x$, $CuTe_x$, $AgTe_x$, $AuTe_x$, $ZnTe_x$, etc.) represent a composition that on average contains x atoms of chalcogen for every one atom of the metal component. As the formulae are representative of relative atomic ratios and not strict chemical formula, the metal chalcogenide material 104 may be stoichiometric or non-stoichiometric, and values of x may be integer or may be non-integer. As used herein, the term "non-stoichiometric" means and includes an elemental composition that cannot be represented by a ratio of well-defined natural numbers and is in violation of the law of definite proportions.

While the metal chalcogenide material 104 is described above as including at least one binary compound, the metal chalcogenide material 104 may also be formed of and include at least one multinary compound, such as a ternary compound or a quaternary compound. If metal chalcogenide material 104 includes a multinary compound, the metal chalcogenide material 104 may include at least one additional element, such as another alkali metal, alkaline earth metal, transition metal, post-transition metal, or metalloid. The additional element may include, but is not limited to, titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co), nickel (Ni), palladium (Pd), platinum (Pd), copper (Cu), silver (Ag), gold (Au), zinc (Zn), cadmium (Cd), aluminum (Al), gallium (Ga), indium (In), tin (Sn), lead (Pb), bismuth (Bi), boron (B), silicon (Si), germanium (Ge), arsenic (As), or antimony (Sb). The additional element may also be a non-metal element(s), such as nitrogen (N), oxygen (O), or phosphorus (P). The additional element(s) may affect the properties of the metal chalcogenide material 104, such as the ability to form the metal chalcogenide material 104 in a crystalline form or an amorphous form. The additional element(s) may be selected to be compatible with the chalcogen and the metal during the ALD process. In additional embodiments, the metal chalcogenide material 104 may be formed of a mixture of at least one binary compound and at least one multinary compound.

The metal chalcogenide material 104 may be formed conformally on or over substrate 102 and features thereof, and may be amorphous or crystalline as formed. A thickness of the metal chalcogenide material 104 and a pressure within a reaction chamber used to form metal chalcogenide material 104 may at least partially control the phase state (e.g., amorphous, semi-amorphous, or crystalline) of the metal chalcogenide material 104. For example, at thicknesses of from about 200 Angstroms (Å) or less, the metal chalcogenide material 104 may be amorphous as formed. If the metal chalcogenide material 104 is amorphous as formed, the metal chalcogenide material 104 may be smooth, uniform, and continuous. As a non-limiting example, if the metal chalcogenide material 104 is formed of and includes amorphous $ZrTe_x$, the metal chalcogenide material 104 may have a root mean square (RMS) of less than or equal to about 2.0 nanometers (nm), such as less than or equal to about 1.6 nanometers, when measured by atomic force microscopy (AFM). If the metal chalcogenide material 104 is crystalline as formed, the chalcogenide material 104 may be rougher, but may exhibit one or more properties desirable for an intended application. As a non-limiting example, if the metal chalcogenide material 104 is formed of and includes crystalline $ZrTe_x$ (e.g., monoclinic $ZrTe_3$), the chalcogenide material 104 may exhibit a resistivity of about 400 μOhm·cm. Impurities such as carbon, oxygen, and nitrogen may be substantially absent from the metal chalcogenide material 104 (i.e., the metal chalcogenide material 104 may include less than or equal to about 1 atomic percent of carbon, oxygen, and nitrogen impurities).

Accordingly, a semiconductor device structure of the disclosure may comprise a zirconium telluride material on a substrate, the zirconium telluride material substantially free of oxygen, nitrogen, and carbon.

The metal chalcogenide material 104 may be formed on or over the substrate 102 using an ALD process. The ALD process may include conducting alternating pulses of at least one metal precursor and at least one chalcogen precursor, with intervening pulses of an inert gas. The inert gas may be nitrogen ($N_2$), argon (Ar), helium (He), neon (Ne), krypton (Kr), xenon (Xe), or other gases that, although not inert, behave as inert under the conditions of the deposition of the precursors. The metal precursor may function as a source of metal for the metal chalcogenide material 104. A single metal precursor species may be included in a particular pulse, or multiple metal precursor species may be included in a particular pulse. The chalcogen precursor may function as a source of chalcogen for the metal chalcogenide material 104. The precursors (i.e., the metal precursor and the chalcogen precursor) may be in a solid, liquid, or gaseous form at room temperature and atmospheric pressure. If the precursors are in a solid or liquid form at room temperature and atmospheric pressure, the precursors may be vaporized before introduction into a chamber holding the substrate 102. Vaporization of the precursors may be accomplished by conventional techniques, which are not described in detail herein. The precursors may be commercially available or synthesized by conventional techniques.

The metal precursor may be an organometallic compound including a complex of metal (e.g., Ti, Zr, Hf, V, Nb, Ta, Cr, Mo, W, Mn, Fe, Co, Ni, Pd, Pt, Cu, Ag, Au, Zn, Cd, B, Al, Ga, In, Si, Ge, Sn, Pb, As, Sb, Bi, or a combination thereof) and at least one ligand. In some embodiments, the metal is Zr. The ligand may be one of an amine group and an imine group, having the chemical formulas $R^1R^2N^-$ and $R^1R^2C=N^-$, respectively, where each of $R^1$ and $R^2$ is independently hydrogen, or an organic group having between one carbon atom and ten carbon atoms. A suitable organic group may be, for example, an alkyl group or an aryl group. The alkyl group may be saturated or unsaturated, linear or branched, and may include heteroaroms, such as oxygen, nitrogen, or sulfur. Thus, each of $R^1$ and $R^2$ may independently be an alkenyl, alkynyl, or alkoxide group. The aryl group may be a phenyl group, a substituted phenyl group, or a heteroatom-containing group, such as a nitrogen-containing group or a sulfur-containing group. In some embodiments, the ligand is dimethylamino. In some embodiments, the metal precursor is tetrakis(dimethylamino)zirconium (TDMAZ).

The chalcogen precursor may be a hydride compound of the chalcogen, an alkyl compound of the chalcogen, or an aryl compound of the chalcogen, such as an alkyl compound of tellurium (Te), selenium (Se), or sulfur (S). The chalcogen precursor may have the chemical formula $Te(R^3R^4)$ or $Se(R^3R^4)$, where each of $R^3$ and $R^4$ is independently H, or an organic group having between one carbon atom and ten carbon atoms. A suitable organic group may be, for example, an alkyl group or an aryl group. The alkyl group may be saturated or unsaturated, linear or branched, and may include heteroaroms, such as oxygen, nitrogen, or sulfur. Thus, each of $R^3$ and $R^4$ may be an alkenyl, alkynyl, or alkoxide group. The aryl group may be a phenyl group, a substituted phenyl group, or a heteroatom-containing group, such as a nitrogen-containing group or a sulfur-containing group. Each of $R^3$ and $R^4$ may be independently selected so that the chalcogen precursor exhibits desired properties, such as reactivity, volatility, and toxicity, for use in the ALD process. As a non-limiting example, the chalcogen precursor may be hydrogen telluride; a dialkyl telluride, such as diemethyl telluride, diethyl telluride, diisopropyl telluride, dibutyl telluride, or bis(t-butyl) telluride; a diaryl telluride; an alkyl tellurane, such as ethyl tellurane; or an aryl tellurane. In some embodiments, the chalcogen precursor is bis(t-butyl) telluride. The metal precursor and the chalcogen precursor may be selected to exhibit sufficient reactivity with one another to form the metal chalcogenide material 104 on the substrate 102.

Selection of the chalcogen precursor may depend on the temperature at which the ALD process is to be conducted. By way of non-limiting example, an alkyl compound may be used when the ALD process is to be conducted at a temperature of from about 20° C. to about 400° C., such as from about 150° C. to about 350° C. In addition to reactivity and volatility considerations, the temperature at which the ALD process is conducted may depend on the thermal budget of the semiconductor device structure 100 in which the metal chalcogenide material 104 is to be used. To prevent damage to other components of the semiconductor device structure 100, the other components formed on, in, or over the substrate 102 should be compatible with the conditions of the ALD process.

To form the metal chalcogenide material 104, the precursors (i.e., the at least one metal precursor and the at least one chalcogen precursor) may be vaporized and sequentially deposited/chemisorbed on or over the substrate 102. As used herein, the terms "chemisorb" and "chemisorption" mean and include a mechanism wherein at least one of the precursors is adsorbed or bound to at least one surface of another material, such as a surface of the substrate 102, by way of chemical bonding, such as covalent bonding or ionic bonding. A first of the precursors is introduced to the substrate 102 under conditions that enable metal from the metal precursor or chalcogen from the chalcogen precursor to react with at least one surface of the substrate 102, forming a chemisorbed monolayer of the metal precursor or the chalcogen precursor thereon. Excess of the first of the precursors may be removed, and a second of the precursors (e.g., the chalcogen precursor if the first of the precursors is the metal precursor, or the metal precursor if the first of the precursors is the chalcogen precursor) is introduced to and reacted with the chemisorbed monolayer of the first of the precursors to form the metal chalcogenide material 104. Excess of the second of the precursors may be removed and, if desired, the above deposition cycle of the ALD process may be repeated to achieve a desired thickness of the metal chalcogenide material 104. The metal of the metal precursor and the chalcogen of the chalcogen precursor function as reactants for each other and eliminate nitrogen-containing groups (e.g., amine groups, or imine groups) during the ALD process. No additional reaction gases are utilized to form the metal chalcogenide material 104. By appropriately selecting the reactivities of the metal precursor and the chalcogen precursor, the reaction of the metal precursor and the chalcogen precursor is thermodynamically favorable. Since the reaction is thermodynamically favorable, the reaction may proceed to completion, enabling the metal chalcogenide material 104 to be formed with minimal amounts of impurities, such as minimal amounts of carbon, nitrogen, and oxygen, if any. Consequently, the metal chalcogenide material 104 may be greater than or equal to about 99 percent pure.

Accordingly, a method of forming a metal telluride material may comprise reacting at least one metal amine compound with at least one tellurium-containing compound to form a metal telluride material on a substrate.

Furthermore, a method of forming a semiconductor device structure may comprise forming a zirconium telluride material on a substrate by atomic layer deposition.

The formation of the metal chalcogenide material 104 through an ALD process utilizing a chalcogen precursor (e.g., bis(t-butyl)tellurium) and a metal precursor including a complex of metal and amine group(s) (e.g., tetrakis(dimethylamino)zirconium) was unexpected. In addition, the purity of the metal chalcogenide material 104 was also unexpected. That is, upon the unexpected formation of the metal chalcogenide material 104, it was believed that the metal chalcogenide material 104 would exhibit carbon, nitrogen, and/or oxygen impurities (i.e., concentrations of carbon, nitrogen, and/or oxygen accounting for greater than 1 atomic percent of the metal chalcogenide material 104). Consequently, the purity of the metal chalcogenide material 104 formed using embodiments of the methods of the disclosure was unexpected.

In some embodiments, a work piece (not shown) such as a carrier to which the substrate 102 is mounted may be placed into (or remain in from previous processing) a chamber (not shown). The chamber may be a conventional ALD reactor, examples of which are known in the art and, therefore, are not described in detail herein. The metal precursor may be introduced into the chamber and may chemisorb to a surface of the substrate 102. For the sake of simplicity, the precursors (i.e., the metal precursor and the chalcogen precursor) are described as being exposed to the substrate 102 in a particular order. However, the precursors may be exposed to the substrate 102 in any order. The metal precursor may be of sufficient volatility and reactivity to react with the surface of the substrate 102. The metal precursor may be introduced into the chamber with an inert gas (e.g., He) to form a mixture of the metal precursor and the inert gas. The metal precursor may be introduced into the chamber for an amount of time sufficient for the reaction to occur, such as from about 0.1 second to about 30 seconds. The metal precursor may be introduced into the chamber at a flow rate of between about 1 sccm and about 100 sccm, a temperature of between about 20° C. and about 400° C., and a pressure of between about 0.0005 Torr and about 1 Torr. A monolayer (not shown) of the metal precursor may be formed on the surface of the substrate 102 as a result of the chemisorption on the surface of substrate 102. The monolayer formed by chemisorption of the metal precursor may be self-terminating since a surface of the monolayer may be non-reactive with the metal precursor used in forming the monolayer.

Subsequent pulsing with inert gas removes excess metal precursor (i.e., metal precursor not chemisorbed to the surface of the substrate 102) from the chamber. Purging the chamber also removes volatile byproducts produced during the ALD process. The inert gas may be introduced into the chamber, for example, for from about 5 seconds to about 120 seconds. After purging, the chamber may be evacuated, or "pumped," to remove gases, such as the excess metal precursor or the volatile byproducts. For example, the excess metal precursor may be purged from the chamber by techniques including, but not limited to, contacting the substrate 102 with the inert gas and/or lowering the pressure in the chamber to below the deposition pressure of the metal precursor to reduce a concentration of the metal precursor contacting the substrate 102 and/or chemisorbed metal precursor. A suitable amount of purging to remove the excess metal precursor and the volatile byproducts may be determined experimentally, as known to those of ordinary skill in the art. The pump and purge sequences may be repeated multiple times.

After purging, the chalcogen precursor may be introduced into the chamber and may chemisorb to exposed surfaces of the monolayer of metal precursor. The chalcogen precursor may be of sufficient volatility and reactivity to react with the chemisorbed metal precursor. The chalcogen precursor may be introduced into the chamber for an amount of time sufficient for the reaction to occur, such as from about 0.1 second to about 30 seconds. For example, the chalcogen precursor may be introduced into the chamber at a flow rate of between about 1 sccm and about 100 sccm, a temperature of between about 20° C. and about 400° C., and a pressure of between about 0.0005 Torr and about 1 Torr. Reaction byproducts and the excess chalcogen precursor may be removed from the chamber utilizing the pump and purge cycle as described above. The chalcogen formation and purging may be repeated any number of times to form a monolayer of chalcogen on the chemisorbed metal. The chalcogen formation and purging may be, for example, repeated in sequence from about two times to about five times to form the monolayer of chalcogen of a desired thickness.

Accordingly, a method of forming a metal chalcogenide material may comprise contacting a substrate with at least one metal precursor and at least one chalcogen precursor, the at least one metal precursor comprising an amine or imine compound of an alkali metal, an alkaline earth metal, a transition metal, a post-transition metal, or a metalloid, and the at least one chalcogen precursor comprising a hydride, alkyl, or aryl compound of sulfur, selenium, or tellurium. The at least one metal precursor and the at least one chalcogen precursor may be reacted to form a metal chalcogenide material over the substrate.

In additional embodiments, at least one other material (not shown) may be located on or over the metal chalcogenide material 104. The other material may, for example, be a conductive material such as one or more of W, Ni, WN, TiN, TaN, polysilicon, and a metal silicide (e.g., $WSi_y$, $TiSi_y$, $CoSi_y$, $TaSi_y$, $MnSi_y$, where y is a rational number greater than zero). The other material may be formed of and include the same material or a different material than the substrate 102. The other material may be formed using known techniques, such as PVD, CVD, or ALD, which are not described in detail herein.

The semiconductor device structure 100 including the metal chalcogen material 104 may be used in a wide variety of semiconductor devices including, but not limited to, photovoltaic devices, and memory devices (e.g., non-volatile memory devices, such as resistive random access memory devices, etc.). Photovoltaic devices may, for example, be used in solar panel devices for power generation. Memory devices may, for example, be used in wireless devices, personal computers, or other electronic devices.

By forming the metal chalcogenide material 104 according to the methods of the disclosure, a highly conformal and substantially pure metal chalcogenide material may be produced. The purity of the metal chalcogenide material may facilitate the formation of semiconductor device structures and semiconductor devices exhibiting excellent performance and stability. In addition, the metal chalcogenide material 104 may be formed from the metal precursors and chalogen precursors without the use of other reactants (e.g., reaction gases), thereby reducing process costs and increasing process efficiency. Furthermore, the methods of the disclosure utilize non-pyrophoric reactants that substantially reduce handling and disposal concerns relative to conventional methodologies.

The following example serves to explain embodiments of the disclosure in more detail. This example is not to be construed as being exhaustive or exclusive as to the scope of the disclosure. While Example 1 describes forming zirconium telluride as the metal chalcogenide material, other metal chalcogenide materials may be formed in a similar manner by appropriately selecting the metal precursor and the chalcogen precursor, as previously described above.

EXAMPLE 1

ALD Process for Forming Zirconium Telluride

Zirconium telluride was produced by an ALD process using tetrakis(dimethylamino)zirconium (TDMAZ) and bis(t-butyl)telluride. A silicon oxide substrate was provided on a chuck within a reaction chamber. The chuck was brought to a temperature of 300° C. The pressure within the reaction chamber was about 5×10 Torr. Solid TDMAZ was heated to a temperature of about 62° C. to form liquid TDMAZ and was then introduced into the reaction chamber in He gas (20 sccm) for about five seconds. After purging with He gas for 20 seconds, the bis(t-butyl)telluride was introduced for about two seconds. The reaction chamber was then purged again with He gas for 20 seconds. The ALD process resulted in a zirconium telluride growth rate of about 0.9 Angstroms per cycle.

EXAMPLE 2

Purity Analysis

Figure 2:
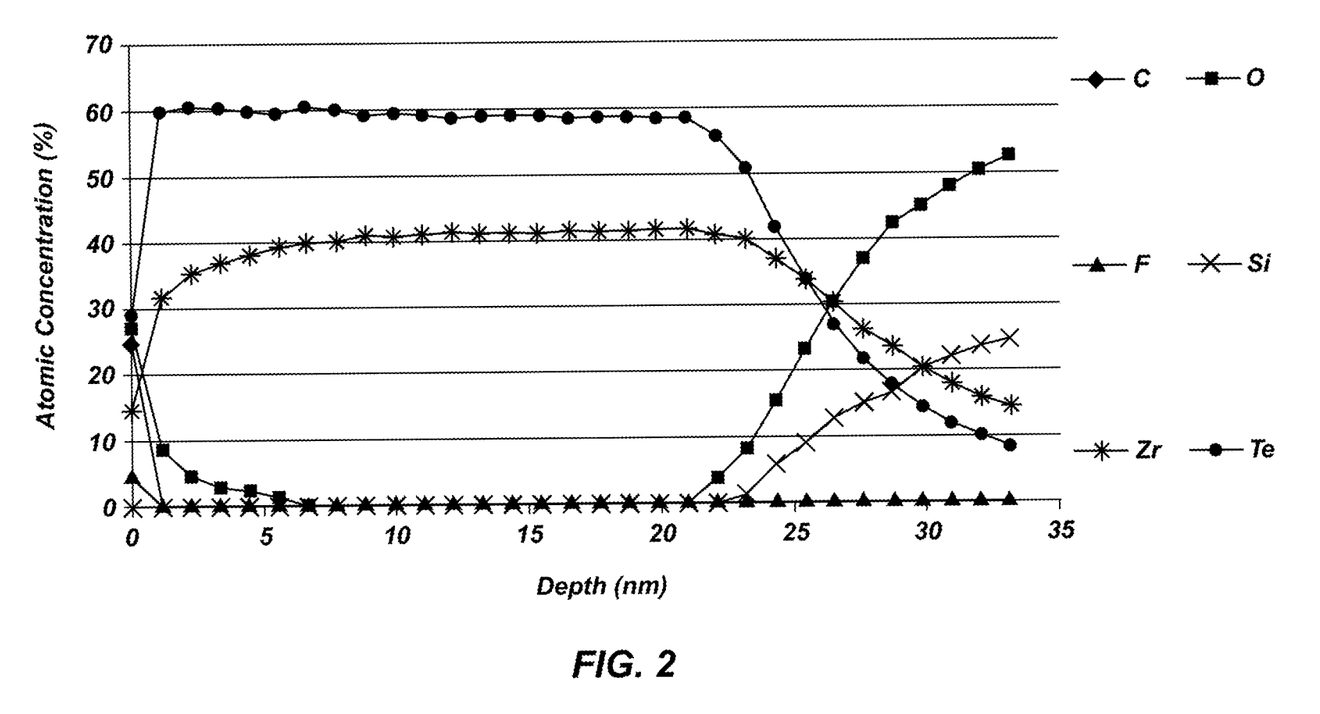
FIG. 2 is an x-ray photoelectron spectroscopy (XPS) depth profile for a zirconium telluride material formed using an embodiment of the disclosure, as described below in Example 2.

Following 300 cycles of the ALD process described in Example 1, the resulting zirconium telluride material was analyzed using x-ray photoelectron spectroscopy (XPS). The XPS depth profile for the zirconium telluride material is shown in FIG. 2. FIG. 2 demonstrates that the zirconium telluride material was highly pure, exhibiting no detectable carbon, nitrogen, or oxygen impurities.

EXAMPLE 3

Smoothness Analysis

Figure 3:
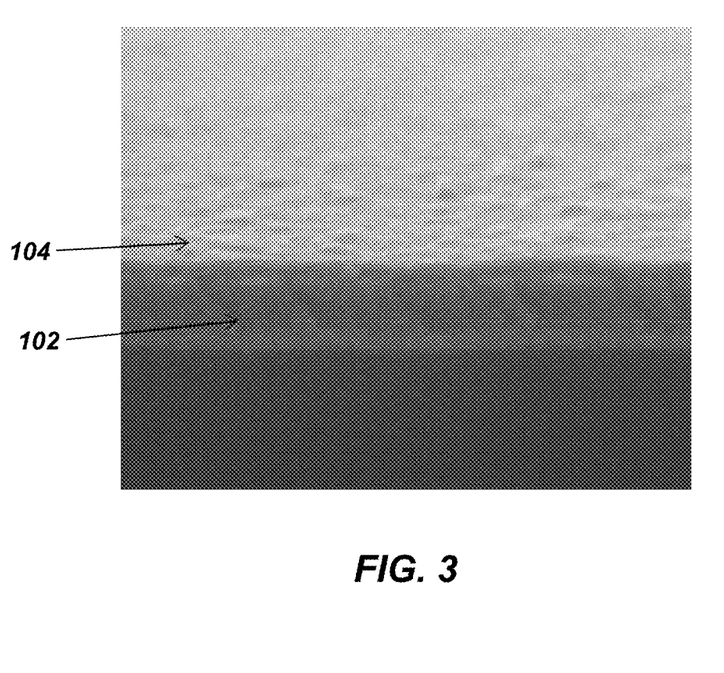
FIG. 3 is a scanning electron micrograph (SEM) of a zirconium telluride material formed using an embodiment of the disclosure, as described below in Example 3.
Figure 4:
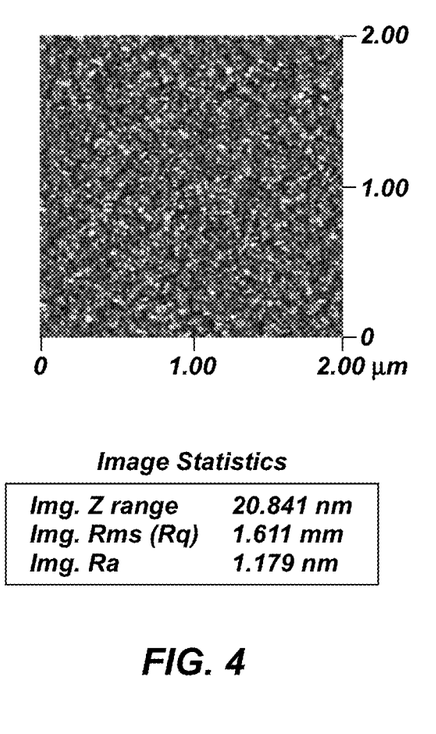
FIG. 4 is an atomic force microscopy (AFM) image of a zirconium telluride material formed using an embodiment of the disclosure, as described below in Example 3.

A 65 Angstrom (Å) thick zirconium telluride material formed on a silicon nitride substrate by the ALD process described in Example 1 was subjected to smoothness analysis. FIG. 3 is a scanning electron micrograph (SEM) showing a perspective view of the zirconium telluride material on the silicon nitride substrate. As shown in FIG. 3, the zirconium telluride material was substantially smooth. FIG. 4 is an atomic force microscopy (AFM) image illustrating that the zirconium telluride material exhibited an RMS of about 1.6 nm, and an average roughness of about 1.2 nm.

EXAMPLE 4

Tape Test

A 65 Å thick zirconium telluride material formed by the ALD process described in Example 1 was subjected to a tape test. A "#" mark was scribed into the center of the zirconium telluride material and a strip of tape was pressed onto the zirconium telluride material and quickly peeled off. No peeling of the zirconium telluride material was exhibited.

EXAMPLE 5

Morphology Analysis

Figure 5:
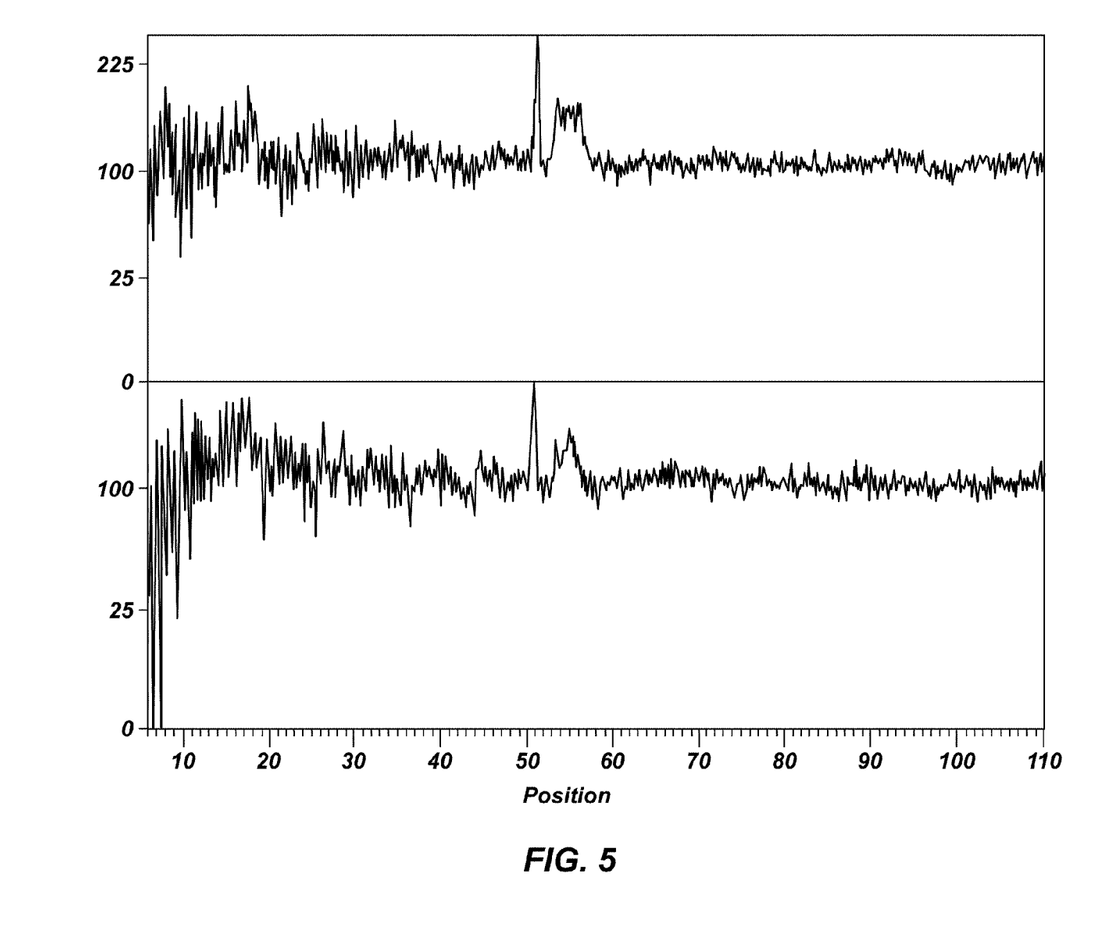
FIG. 5 is an x-ray diffraction (XRD) diagram of a zirconium telluride material formed using an embodiment of the disclosure, as described below in Example 5.

A 65 Å thick zirconium telluride material formed by the ALD process described in Example 1 was subjected to morphology analysis. FIG. 5 is an x-ray diffraction (XRD) diagram of the zirconium telluride material. FIG. 5 demonstrates that the zirconium telluride material was amorphous as deposited.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the following appended claims and their legal equivalents.

What is claimed is:

1. A method of forming a metal chalcogenide material, comprising:
    chemisorbing at least one metal precursor and at least one chalcogen precursor over a substrate, the at least one metal precursor comprising an amine or imine compound of an alkali metal, an alkaline earth metal, a transition metal, a post-transition metal, or a metalloid, and the at least one chalcogen precursor comprising a hydride, alkyl, or aryl compound of sulfur, selenium, or tellurium; and
    reacting the at least one metal precursor and the at least one chalcogen precursor to form a metal chalcogenide material over the substrate.

2. The method of claim 1, wherein chemisorbing at least one metal precursor and at least one chalcogen precursor over a substrate contacting the substrate with the at least one metal precursor comprising an amine or imine compound of Ti, Zr, Hf, V, Nb, Ta, Cr, Mo, W, Mn, Fe, Co, Ni, Pd, Pt, Cu, Ag, Au, Zn, Cd, B, Al, Ga, In, Sn, Pb, Bi, Si, Ge, As, or Sb.

3. The method of claim 1, wherein chemisorbing at least one metal precursor and at least one chalcogen precursor over a substrate contacting the substrate with the at least one metal precursor comprising at least one amine group having the formula $R^1R^2N^-$, where each of $R^1$ and $R^2$ independently comprises hydrogen, or an organic group having between one carbon atom and ten carbon atoms.

4. The method of claim 1, wherein chemisorbing at least one metal precursor and at least one chalcogen precursor over a substrate introducing the at least one chalcogen precursor comprising $Te(R^3R^4)$ or $Se(R^3R^4)$, where each of $R^3$ and $R^4$ independently comprises hydrogen, or an organic group having between one carbon atom and ten carbon atoms.

5. The method of claim 1, wherein chemisorbing at least one metal precursor and at least one chalcogen precursor over a substrate comprises contacting the substrate with the at least one chalcogen precursor comprising hydrogen telluride, a dialkyl telluride, a diaryl telluride, an alkyl tellurane, or an aryl tellurane.

6. The method of claim 1, wherein reacting the at least one metal precursor and the at least one chalcogen precursor to form a metal chalcogenide material over the substrate comprises forming zirconium telluride, copper telluride, silver telluride, gold telluride, zinc telluride, aluminum telluride, gallium telluride, indium telluride, tin telluride, bismuth telluride, germanium telluride, arsenic telluride, antimony telluride, bismuth telluride, zirconium selenide, copper selenide, silver selenide, gold selenide, zinc selenide, aluminum selenide, gallium selenide, indium selenide, tin selenide, bismuth selenide, germanium selenide, arsenic selenide, antimony selenide, bismuth selenide, zirconium sulfide, copper sulfide, silver sulfide, gold sulfide, zinc sulfide, bismuth sulfide, indium sulfide, or antimony sulfide on the substrate.

7. The method of claim 1, wherein chemisorbing at least one metal precursor and at least one chalcogen precursor over a substrate comprises introducing the at least one metal precursor and the at least one chalcogen precursor into a chamber without an additional reactant.

8. The method of claim 1, wherein chemisorbing at least one metal precursor and at least one chalcogen precursor over a substrate comprises sequentially introducing the at least one metal precursor and the at least one chalcogen precursor into a chamber having the substrate therein.

9. The method of claim 1, further comprising including at least one additional element in the metal chalcogenide material.

10. The method of claim 9, wherein including at least one additional element in the metal chalcogenide material comprises including at least one of Ti, Zr, Hf, V, Nb, Ta, Cr, Mo, W, Mn, Fe, Co, Ni, Pd, Pt, Cu, Ag, Au, Zn, Cd, B, Al, Ga, In, Sn, Pb, Bi, Si, Ge, As, Sb, C, N, O, or P in the metal chalcogenide material.

11. The method of claim 1, wherein chemisorbing at least one metal precursor and at least one chalcogen precursor over a substrate and reacting the at least one metal precursor and the at least one chalcogen precursor to form a metal chalcogenide material on the substrate comprises forming the metal chalcogenide material by atomic layer deposition.

12. The method of claim 1, wherein forming a metal chalcogenide material over the substrate comprises forming the metal chalcogenide material on the substrate.

13. The method of claim 1, wherein chemisorbing at least one metal precursor and at least one chalcogen precursor over a substrate comprises sequentially depositing the at least one metal precursor and the at least one chalcogen precursor over the substrate.

14. A method of forming a metal chalcogenide material, comprising:
    contacting a substrate with tetrakis(dialkylamino)zirconium and at least one chalcogen precursor comprising a hydride, alkyl, or aryl compound of sulfur, selenium, or tellurium; and
    reacting the tetrakis(dialkylamino)zirconium and the at least one chalcogen precursor to form a zirconium chalcogenide material over the substrate.

15. The method of claim 14, wherein contacting the substrate with tetrakis(dialkylamino)zirconium comprises introducing the tetrakis(dimethylamino)zirconium into a chamber having the substrate therein.

16. A method of forming a metal chalcogenide material, comprising:
    contacting a substrate with at least one metal amine compound and at least one tellurium-containing compound; and
    reacting the at least one metal amine compound and the at least one tellurium-containing compound to form a metal telluride material over the substrate.

17. The method of claim 16, wherein contacting a substrate with at least one metal amine compound and at least one tellurium-containing compound comprises contacting the substrate with at least one zirconium amine compound and at least one tellurium alkyl compound.

18. The method of claim 16, wherein contacting a substrate with at least one metal amine compound and at least one tellurium-containing compound comprises contacting the substrate with tetrakis(dimethylamino)zirconium and bis(t-butyl)telluride.

* * * * *